United States Patent
Takasou

(10) Patent No.: US 7,742,300 B2
(45) Date of Patent: Jun. 22, 2010

(54) IN-VEHICLE APPARATUS

(75) Inventor: Kazuo Takasou, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/382,440

(22) Filed: Mar. 17, 2009

(65) Prior Publication Data

US 2009/0244841 A1     Oct. 1, 2009

(30) Foreign Application Priority Data

Mar. 25, 2008   (JP) ................... 2008-078685

(51) Int. Cl.
*H05K 7/20* (2006.01)
(52) U.S. Cl. .................. 361/695; 361/688; 361/690; 361/679.05; 361/679.06
(58) Field of Classification Search ........... None
See application file for complete search history.

(56) References Cited

U.S. PATENT DOCUMENTS

| | | | | |
|---|---|---|---|---|
| 5,953,302 | A * | 9/1999 | Kobayashi | ............... 720/647 |
| 6,288,891 | B1 * | 9/2001 | Hasegawa et al. | ...... 361/679.07 |
| 7,137,676 | B2 * | 11/2006 | Sugimoto et al. | ............ 312/7.2 |
| 7,304,836 | B2 * | 12/2007 | Nakamura et al. | ..... 361/679.27 |
| 7,606,473 | B2 * | 10/2009 | Ikunami | ..................... 386/125 |
| 2004/0070932 | A1 | 4/2004 | Dobbs et al. | |
| 2008/0013264 | A1 * | 1/2008 | Ido | ............................ 361/681 |
| 2008/0013266 | A1 * | 1/2008 | Yamada et al. | ............. 361/681 |
| 2008/0259545 | A1 * | 10/2008 | Park et al. | ................... 361/681 |

FOREIGN PATENT DOCUMENTS

| | | |
|---|---|---|
| JP | A-2003-224990 | 8/2003 |
| JP | A-2006-114869 | 4/2006 |
| JP | A-2006-347495 | 12/2006 |

* cited by examiner

*Primary Examiner*—Boris L Chervinsky
(74) *Attorney, Agent, or Firm*—Posz Law Group, PLC

(57) ABSTRACT

An audio-integrated apparatus has a body casing attached in an instrument panel of a vehicle. The body casing contains a media reader, a circuit board having a CPU, a CPU fan for cooling the CPU, and an exhaust fan. A media loading slot is in a front face of the body casing for inserting a media. A movable display section is in front of the body casing to be movable in a back-and-forth direction. A display movement mechanism can move the movable display section in the back-and-forth direction to thereby change an inclination against the front face of the body casing. A gear motor can detect a position of the movable display section. According to the detected position of the movable display section, rotational frequencies of the CPU fan and the exhaust fan are controlled.

9 Claims, 3 Drawing Sheets

FIG. 1  MOVABLE DISPLAY: ENTIRELY CLOSING STATE
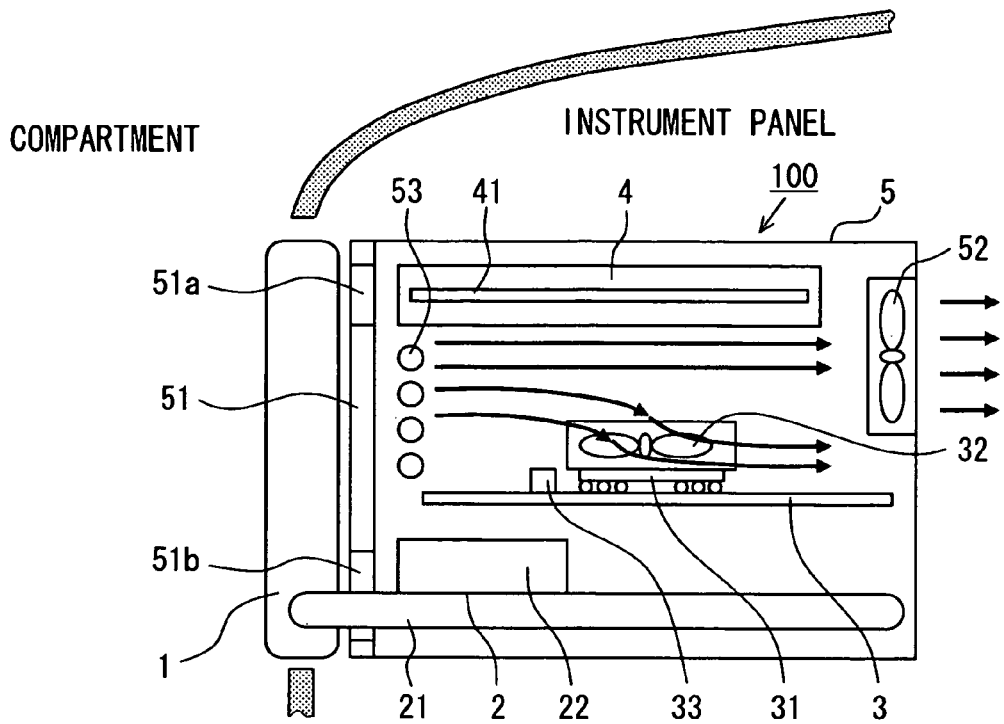
FIG. 2  MOVABLE DISPLAY: MAXIMALLY EXTENDING STATE
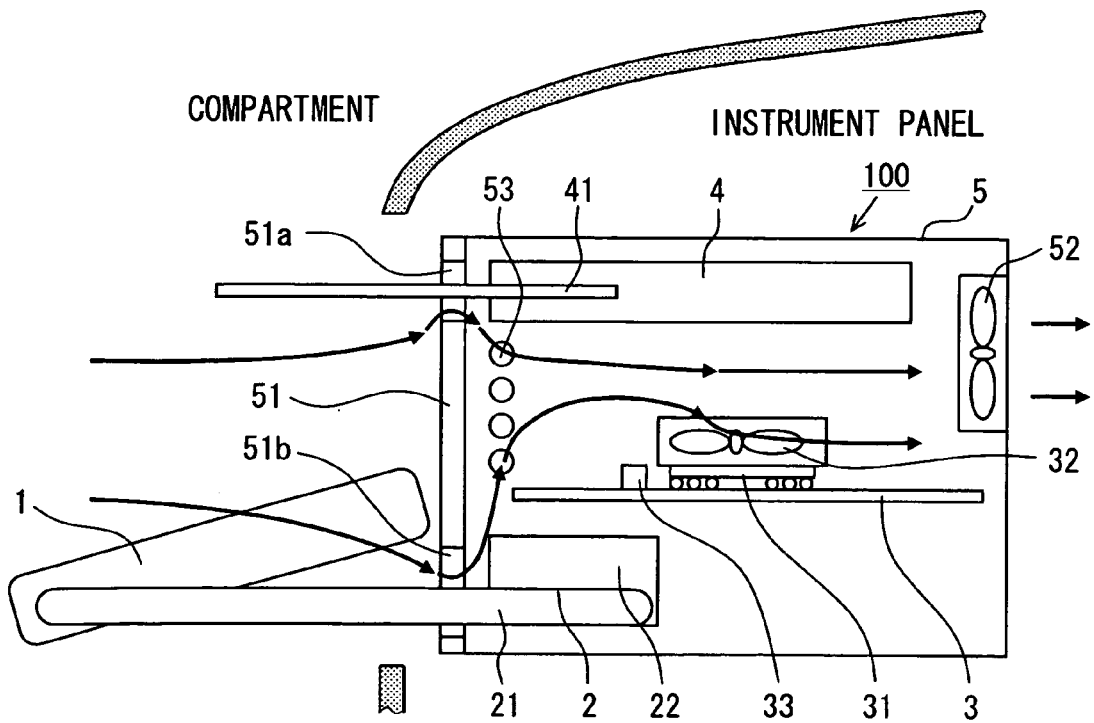

FIG. 3  MOVABLE DISPLAY: ANGLE ADJUSTING STATE
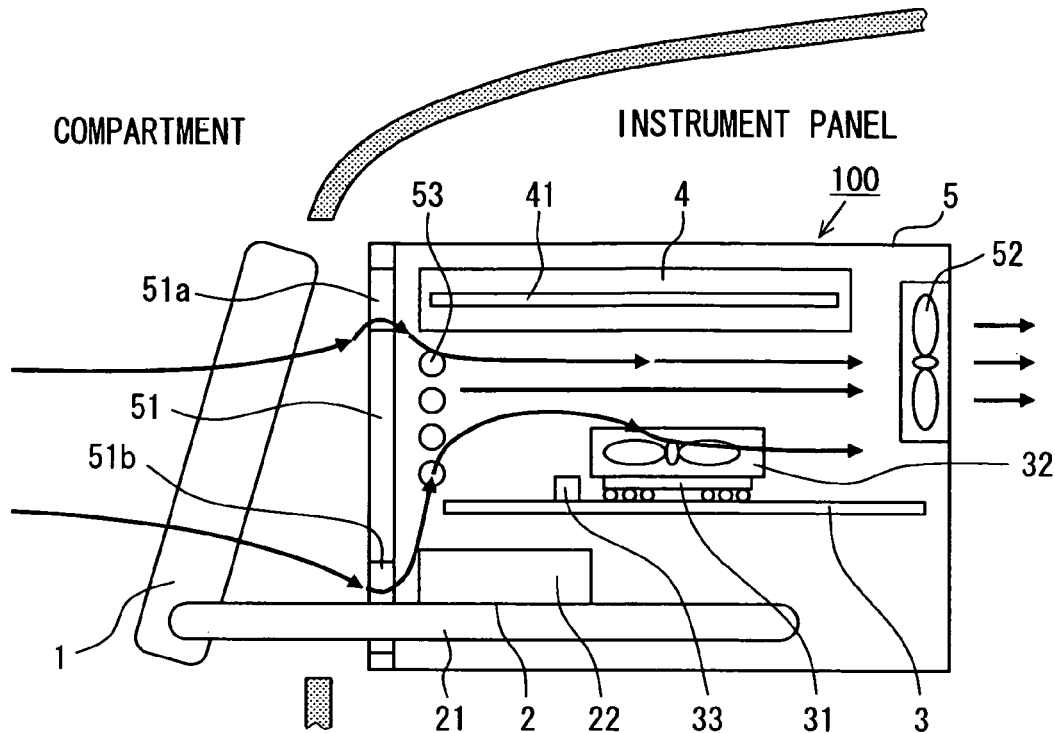
FIG. 4
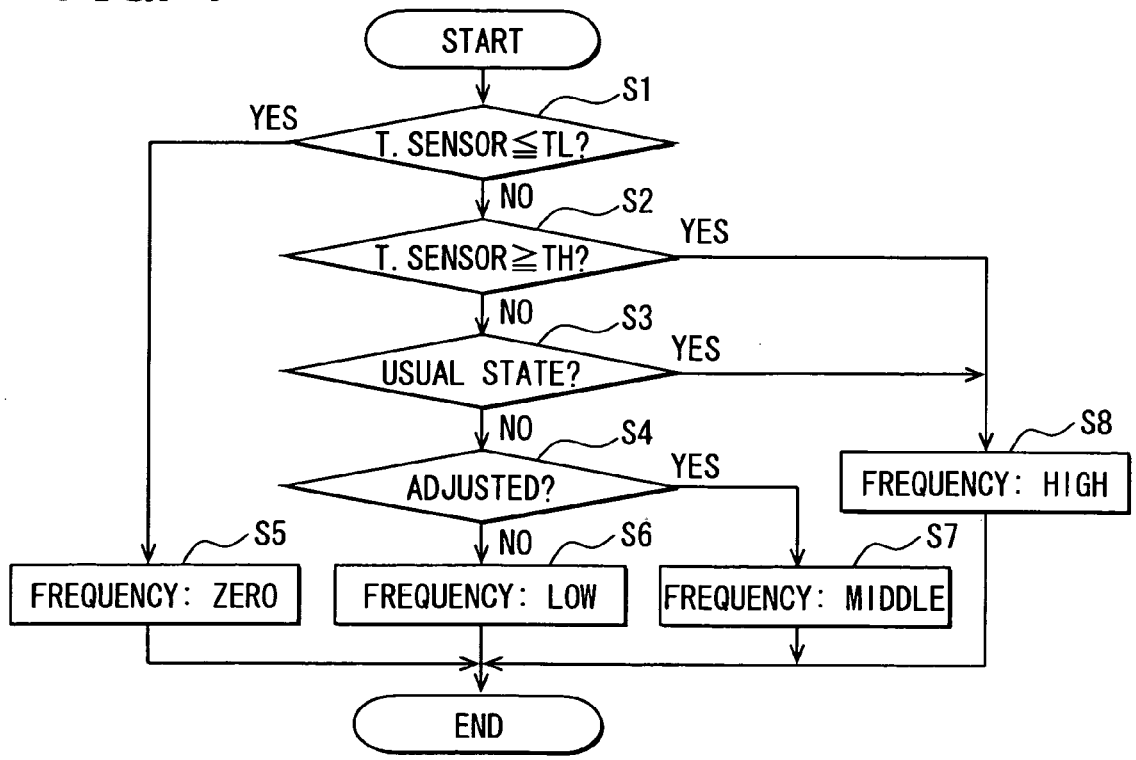

IN-VEHICLE APPARATUS

CROSS REFERENCE TO RELATED APPLICATION

This application is based on and incorporates herein by reference Japanese Patent Application No. 2008-78685 filed on Mar. 25, 2008.

FIELD OF THE INVENTION

The present invention relates to a technology to help prevent a thermal destruction using a cooling fan in an in-vehicle apparatus such as a car audio or car navigation apparatus.

BACKGROUND OF THE INVENTION

Patent document 1: JP-2003-224990 A
Patent document 1: JP-2006-114869 A
Patent document 1: JP-2006-347495 A While an in-vehicle navigation apparatus is developed for achieving high performances, a CPU provided in a circuit board of the navigation apparatus continues significant enhancement in a processing performance. In connection, the power consumption of the CPU increases and a heat dissipation of the CPU also increases. Accordingly, also in the circuit board in the navigation apparatus, a cooling capability against the heat dissipation of the CPU has been needed in recent years.

Specifically, a fan cooling structure dedicated for the CPU becomes common as a method for improving the cooling capability. In order to anticipate such tendency further proceeding, the number of fans or rotational frequencies of fans may be increased further, or sizes of fans may be enlarged further for enhancing the cooling capability. Thus, the operating sound of the fans may increase to be thereby expected to increase aggravation of the marketability of the navigation apparatus.

Patent documents 1 to 3 describe technologies to solve such a problem. Such technologies provide a method to estimate a loudness level of sounds in a vehicle compartment by detecting an amount of audio sounds, an amount of air-conditioner air blasting, a travel speed, an engine speed value, window opening and closing, etc. The rotational frequency of the cooling fan is thereby increased such that the operating sound does not provide the problem to thereby securing or maintaining the cooling capability.

In contrast, a navigation apparatus is required to be downsized from the aspect of securing more room in a vehicle compartment in recent years. For example, it is desired to prepare an audio-integrated apparatus, in which a navigation apparatus is united or integrated with an audio apparatus. Such an audio-integrated apparatus should include all the functions of an audio apparatus, a navigation apparatus, and a display apparatus in a usual mount space or dimensions, which has a usual DIN size. Herein, DIN signifies Deutsche Industrie Normen, namely, German industrial standard. The size of 50 mm high and 178 mm wide is called "1 DIN" while the size of 100 mm high and 178 mm wide is called "2 DIN." Under such a circumstance, the audio-integrated apparatus is often provided with a display movement mechanism. Further, all those functions are required to be mounted in DIN size, thereby increasing a heat dissipation per cubic volume and operating sounds of the cooling fan(s) in the apparatus. This may involve a problem.

The above technologies described in Patent documents 1 to 3 do not indicate a control of the cooling fan with respect to the states of the display movement mechanism in the audio-integrated apparatus. In addition, although referring to a relation between the cooling fan control and the operation sounds, no consideration is made to a dew condensation inside the apparatus accompanying the cooling air capacity increase and dust entry.

Herein, the audio-integrated apparatus is provided with the display movement mechanism from the following reasons:
(1) easy loading and unloading of musical media by exposing a front face of an audio section;
(2) matching a sight line of a vehicle occupant by adjusting an angle or inclination of a display unit; and
(3) storing the display unit when the display function is unnecessary.

SUMMARY OF THE INVENTION

It is an object to provide a technology to reduce a leakage of a cooling fan operating sound to a vehicle compartment while securing a capability of cooling an in-vehicle apparatus such as a car audio apparatus or navigation apparatus.

According to an example of the present invention, an in-vehicle apparatus for a vehicle is provided as follows. A main body contains (i) a data read-out section configured to read data from a storage medium, (ii) a circuit board containing a CPU for processing data read by the data read-out section, and (iii) a cooling fan to cool the CPU. The main body has, in a front face thereof, a loading slot for inserting the storage medium. A movable display section is arranged in front of the main body and movable in a back-and-forth direction while having a display unit to display information in a front face of the display unit. A drive mechanism is configured to move the movable display section in the back-and-forth direction while changing, of the movable display section, an inclination state relative to the main body. A position detection section is configured to detect a position of the movable display section. A control section is configured to control a rotational frequency of the cooling fan based on a position of the movable display section detected by the position detection section.

BRIEF DESCRIPTION OF THE DRAWINGS

The above and other objects, features, and advantages of the present invention will become more apparent from the following detailed description made with reference to the accompanying drawings. In the drawings:

FIG. 1 is a sectional side view of a configuration of an in-vehicle apparatus in a usual entirely closing state of a movable display section according to an embodiment of the present invention;

FIG. 2 is a sectional side view of a configuration of the in-vehicle apparatus in a maximally extending state of the movable display section in which a storage medium is loaded or unloaded;

FIG. 3 is a section a side view of a configuration of the in-vehicle apparatus in an angle adjusting state of the movable display section in which a visibility for a vehicle occupant is improved by adjusting a mount angle;

FIG. 4 is a flowchart of a setting process for a cooling fan target rotational frequency.

DETAILED DESCRIPTION OF THE PREFERRED EMBODIMENTS

Figure 5:
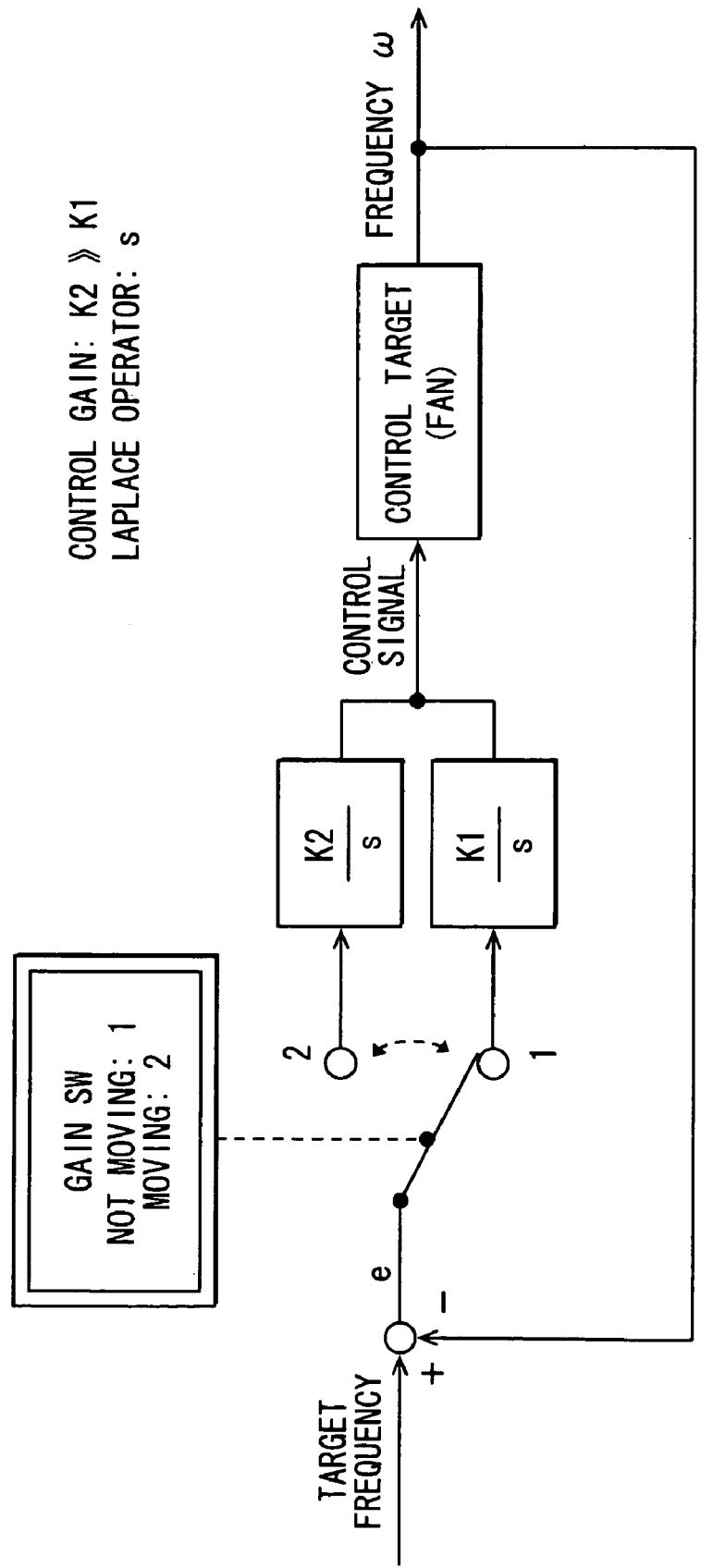
FIG. 5 is a diagram illustrating a control block of a cooling fan rotational frequency.

Hereinafter, description will be given to an embodiment of the present invention with reference to the drawings. In addition, without being limited to the following explanation of the embodiment, the embodiment of the present invention can be achieved in various different manners.

Embodiment

FIGS. 1 to 3 illustrate schematic sectional side views of configurations of an audio-integrated apparatus according to an embodiment of the present invention. FIG. 1 illustrates a movable display screen in an entirely closing state (also referred to as a concealing position) when the apparatus is usually used. FIG. 2 illustrates a movable display section in a maximally moving state (also referred to as a maximally exposing position) when a media such as a compact disk is loaded to or unloaded from the apparatus. FIG. 3 illustrates a movable display section in an angle adjusting state (also referred to as a partially exposing position) when a visibility for a vehicle occupant is improved by adjusting a mount angle or inclination angle of the movable display section.

(Audio-Integrated Apparatus)

The audio-integrated apparatus 100 is an in-vehicle apparatus having an audio function and a navigation function. As illustrated in FIGS. 1 to 3, the apparatus 100 includes a movable display section 1, a display movement mechanism 2, a circuit board 3, a media reader 4 for a media such as a compact disk, and a body casing 5. The display movement mechanism 2, the circuit board 3, and the media reader 4 are mounted or attached in the body casing 5.

In addition, the audio-integrated apparatus 100 is attached or inserted via an opening to an inside of an instrument panel, which is extended from the bottom border of the front windshield towards occupant seats inside of the vehicle compartment.

(Movable Display Section)

The movable display section 1 is arranged in front of the body casing 5 to be movable in a back-and-forth direction. Specifically, the movable display section 1 is driven by the display movement mechanism 2 mentioned later to move from the entirely closing state (also referred to as a concealing position, see FIG. 1), in which a front face of the body casing 5 is entirely concealed, via an angle adjusting state (also referred to as a partially exposing position, see FIG. 3), in which the front face of the body casing 5 is partially exposed, to a maximally extending state (also referred to as a maximally exposing position, see FIG. 2), in which the almost entire front face of the body casing 5 is exposed. In addition, the movable display section 1 includes a display unit (not illustrated) for displaying a variety of information.

(Display Movement Mechanism)

The display movement mechanism 2 includes a slider 21 to move in conjunction with opening and closing, and a gear motor 22 to drive the slider 21. Furthermore, the display movement mechanism 2 can change an inclination or angle against the front face of the body casing 5 while moving the movable display section 1 in a back-and-forth direction. Herein, a forth direction of the audio-integrated apparatus 100 signifies a direction approaching vehicle occupant seats in the vehicle compartment (i.e., a vehicle backing direction), while a back direction signifies a direction approaching the windshield of the vehicle (i.e., a vehicle heading direction). In addition, the gear motor 22 has a function for detecting a position of the slider 21 or movable display section 1. In addition, the display movement mechanism 2 can function as a drive mechanism.

(Media Reader)

A media 41 is inserted to or discharged from (i.e., loaded to or unloaded from) the media reader 4, as needed, for an operator. The media 41 functions as a storage medium which has data contents, such as music or video. The media reader 4 functions as a data read-out section which has a function to read the data from the media 41.

(Circuit Board)

The circuit board 3 contains a CPU 31 to process the data read by the media reader 4, a CPU fan 32 for cooling the CPU 31, and a temperature sensor 33 for observing a cooling state of the CPU 31. The circuit board 3 achieves well-known audio function and navigation function. Thus, to achieve the multiple functions, the data volume processed by the CPU 31 is increased; accordingly, a lot of heat is generated or dissipated from the CPU 31 to increase the temperature of the CPU 31. Thus, the CPU 31 needs to be cooled by the CPU fan 32.

In the present embodiment, a single circuit board 3 is provided to realize the audio function and the navigation function. In contrast, several circuit boards 3 may be provided so that one of the circuit boards 3 realizes the audio function and another of the circuit boards 3 realizes the navigation function.

(Body Casing)

The body casing 5 is shaped of an approximately rectangular solid. The body casing 5 contains the display movement mechanism 2, the circuit board 3, and the media reader 4. In addition, in front of the body casing 5, the movable display section 1 is arranged to be supported by the display movement mechanism 2. The body casing 5 is mounted inside of the instrument panel of the vehicle compartment while the front face (i.e., display screen of the display unit) of the movable display section 1 faces the vehicle compartment. In addition, the body casing 5 together with the circuit board 3 and the media reader 4 is included in a main body of the in-vehicle apparatus 100.

In addition, a design panel 51 is attached to the front face of the body casing 5. The design panel 51 is provided with a media loading slot 51a and a clearance 51b. The media loading slot 51a is used for inserting and discharging a storage media, such as a compact disk. The clearance 51b is used for accommodating the slider 21 which moves along with the open-close operation in the back-and-forth direction. Furthermore, the body casing 5 is provided with an exhaust slot in a rear face for an exhaust gas. An exhaust fan 52 is attached to the exhaust slot for heat dissipation for the whole apparatus. In addition, four suction holes 53 are provided in an anterior portion on each of both sides of the body casing 5 for communicating an inside of the body casing 5 and an inside of the instrument panel with each other. In addition, the exhaust fan 52 together with the CPU fan 32 function as a cooling fan for cooling the apparatus 100.

(Audio-Integrated Apparatus)

Next, the following explains an operation of the audio-integrated apparatus 100, with reference to FIGS. 1 to 3, (1) when the movable display section 1 is in the entirely closing state, (2) when the movable display section 1 is in the maximally extending state, and (3) when the movable display section 1 is in the angle adjusting state.

(1) When the Movable Display Section 1 is in the Entirely Closing State

As illustrated in FIG. 1, when the movable display section 1 is in the entirely closing state in the typical use state, an interval between the design panel 51 and the rear face of the movable display section 1 has almost no room, the front face of the body casing 5 is almost covered by the movable display section 1. Accordingly, the forced convection by the exhaust fan 52 is performed by almost suctioning via the suction holes 53. Since the suction holes 53 are formed in an anterior portion of the body casing 5, the atmosphere inside of the instrument panel is suctioned. As a result, the atmosphere inside the instrument panel circulates through the inside of the body casing 5. In such a state, it is thus necessary to determine the rotational frequencies of both the CPU fan 32 and exhaust fan 52 to satisfy an operating sound standard specification of the whole apparatus while effectuating the capability of cooling the CPU 31 on the circuit board 3. Herein, a rotational frequency of a fan can be also referred to the number of rotations of the fan.

(2) When the Movable Display Section 1 is in the Maximally Extending State

As illustrated in FIG. 2, when the movable display section 1 is in the maximally extending state while a media is loaded or unloaded, the design panel 51 is not covered by the rear face of the movable display section 1, and an interval between the design panel 51 and the rear face of the movable display section 1 has a space. Accordingly, the forced convection by the exhaust fan 52 is performed by suctioning the considerable quantity through the media loading slot 51a and the clearance 51b for accommodating the slider 21. In addition, since the design panel 51 is almost entirely exposed to the vehicle compartment, the atmosphere of the vehicle compartment is suctioned. As a result, a considerable quantity of the atmosphere inside of the vehicle compartment is suctioned to the inside of the body casing 5. The atmosphere temperature inside of the vehicle compartment is relatively lower than that inside of the instrument panel. Therefore, the capability of cooling the CPU 31 can be easily effectuated. Herein, the operating sound of the whole apparatus containing the CPU fan 32 and the exhaust fan 52 easily leaks to the vehicle compartment via the media loading slot 51a and the clearance 51b for accommodating the slider 21.

Furthermore, when the movable display section 1 is in the maximally extending state, the atmosphere in the vehicle compartment is positively suctioned by the exhaust fan 52, the suctioning of dust is accelerated. This facilitates the dirt of the media reader 4 containing an optical device such as a compact disk to thereby involve the performance degradation. Further, the air flow path resistance is increased to thereby involve the deterioration of the cooling capability. Thus, the life degradation of the apparatus accelerates. In addition, in a low temperature, the malfunction of the circuit board 3 due to the dew condensation inside the body casing 5 may occur to thereby involve the reliability deterioration.

The rotational frequencies of the CPU fan 32 and exhaust fan 52 are therefore lowered more significantly than the usual state, to be thereby able to maintain the operating sound of the whole apparatus at an acceptable level while securing the capability of cooling the CPU 31. In addition, the entry of the vehicle compartment atmosphere having relatively high humidity and much dust can be reduced. The reliability and durability of the audio-integrated apparatus 100 can improve.

(3) When the Movable Display Section 1 is in the Angle Adjusting State

The movable display section 1 is in the angle adjusting state for improving the visibility from a vehicle occupant such as a driver or fellow passenger. As illustrated in FIG. 3, the easiness in the leakage of the operating sound of the whole apparatus and the inflow of the atmosphere of the vehicle compartment are similar, in varying degrees, to the case in the maximally extending state. The rotational frequencies of the CPU fan 32 and exhaust fan 52 are therefore lowered appropriately as compared with the usual state. The above problem can be solvable similarly.

However, when the temperature sensor 33 for monitoring the cooling state of the CPU 31 detects that the temperature around the CPU 31 (i.e., the temperature of the vicinity to the CPU 31) is equal to or greater than a predetermined temperature value, it is determined that the atmosphere temperature of the vehicle compartment is not less enough than that of the inside of the instrument panel. The prevention of the damage of the CPU 31 and peripheral elements is helped by maintaining the rotational frequencies of the CPU fan 32 and the exhaust fan 52.

Further, when the temperature sensor 33 for monitoring the cooling state of the CPU 31 detects that the temperature around the CPU 31 is less than the predetermined temperature value, it is determined that the CPU 31 is too low to need the forced cooling. Thereby, the rotational frequencies of the CPU fan 32 and exhaust fan 52 are controlled to be low enough or stopped. This reduces the possibility of the dew condensation to the circuit board 3 due to the circulation of the comparatively humid vehicle compartment atmosphere.

(Cooling Fan Rotational Frequency Setting)

Next, a setting process or flowchart for the cooling fan rotational frequency (i.e., the number of rotations) for achieving the operation of the above audio-integrated apparatus 100 is explained with reference to FIG. 4.

The present process is started based on an operation instruction (i.e., instruction signal) of the movable display section 1. First, it is determined at S1 whether the temperature (i.e., the value of the temperature) of the vicinity to the CPU 31 detected by the temperature sensor 33 for monitoring the cooling state of the CPU 31 is equal to or less than a predetermined lower-temperature side threshold temperature TL (allowable temperature value). In addition, the threshold temperature TL as the allowable temperature value signifies a threshold temperature which does not need to cool the CPU 31. When it is determined that the temperature of the vicinity to the CPU 31 is equal to or less than the threshold temperature TL, corresponding to YES at S1, it is determined that the CPU 31 is too low to need the forced cooling. The target rotational frequency of each of the CPU fan 32 and exhaust fan 52 is set to the numerical value "0" at S5. The CPU fan 32 and the exhaust fan 52 are stopped. The present process is then ended.

In contrast, when it is determined that the temperature value of the vicinity to the CPU 31 is greater than the threshold temperature TL, corresponding to NO at S1, it is determined at S2 whether the temperature (i.e., the value of the temperature) of the vicinity to the CPU 31 detected by the temperature sensor 33 for monitoring the cooling state of the CPU 31 is equal to or greater than a predetermined higher-temperature side threshold temperature TH (cooling-necessitating temperature value). In addition, the threshold temperature TH as the cooling-necessitating temperature value signifies a threshold temperature which need to cool the CPU 31. When it is determined that the temperature of the vicinity to the CPU 31 is equal to or greater than the predetermined higher-temperature side threshold temperature TH, corresponding to YES at S2, the target rotational frequency of each of the CPU fan 32 and exhaust fan 52 is set to "HIGH" (a first allowable rotational frequency). In addition, the target rotational frequency "HIGH" is set so as to satisfy the operating sound standard specification of the whole apparatus while effectuating the capability of cooling the CPU 31 in the circuit board 3 when the movable display section 1 is in the entirely closing state. The present process is then ended.

In contrast, when it is determined that the temperature of the vicinity to the CPU 31 detected by the temperature sensor 33 is less than the predetermined higher-temperature side threshold temperature TH (cooling-necessitating temperature value), corresponding to NO at S2, it is determined at S3 whether the movable display section 1 is in the entirely closing state (i.e., in the usual state) based on the output signal from the gear motor 22. When it is determined that the movable display section 1 is in the entirely closing state, corresponding to YES at S3, the target rotational frequency (i.e., the number of rotations) of each of the CPU fan 32 and exhaust fan 52 is set to "HIGH" (the first allowable rotational frequency) at S8. The present process is then ended.

When it is determined that the movable display section 1 is not in the entirely closing state, corresponding to NO at S3, it is determined at S4 whether the movable display section 1 is in the angle adjusting state based on the output signal from the gear motor 22. When it is determined that the movable display section 1 is in the angle adjusting state, corresponding to YES at S4, the target rotational frequency of each of the CPU fan 32 and exhaust fan 52 is set to "MIDDLE" (a second allowable rotational frequency) at S7. In addition, the rotational frequency "MIDDLE" is set to satisfy the operating sound standard specification of the whole apparatus while effectuating the capability of cooling the CPU 31 in the circuit board 3 when the movable display section 1 is in the angle adjusting state. The present process is then ended.

In contrast, when it is determined that the movable display section 1 is not in the angle adjusting state, corresponding to NO at S4, it is determined that the movable display section 1 is in the maximally extending state, the target rotational frequency of each of the CPU fan 32 and exhaust fan 52 is set to "LOW" (a third allowable rotational frequency) at S6. In addition, the target number of revolutions "LOW" is set to satisfy the operating sound standard specification of the whole apparatus while effectuating the capability of cooling the CPU 31 in the circuit board 3 when the movable display section 1 is in the maximally extending state. The present process is then ended.

In addition, the present process may be executed by the CPU 31. Alternatively, another microcomputer can be provided in the circuit board 3 to execute the present process. Further, a discrete circuit can be mounted in the circuit board 3 for executing the present process.

(Frequency Control for the Cooling Fan)

In addition, after termination of the present process, the frequency control for controlling the CPU fan 32 and the exhaust fan 52 to the set rotational frequency is executed. That is, as illustrated in the control block of FIG. 5, the rotational frequency of each of the CPU fan 32 and exhaust fan 52 as a control target is directed to the target rotational frequency set by the setting process of the above-mentioned cooling fan rotational frequency.

For instance, an integration (1/s) control is adopted to approximate the deviation e from the target of rotational frequency ω to the numerical value "0."Usually, in consideration that the human being's ear is sensitive to the change of the sound pressure, it is necessary to change the fan's rotational frequency gently. Accordingly, the sufficiently small value is set to the control gain K1. However, in the present embodiment, while the display movement mechanism 2 operates, the operating sound of the gear motor 22 is dominant. The operating sound of the CPU fan 32 and the exhaust fan 52 is drowned out. The integral control is performed by switching to the sufficiently large control gain K2 to thereby quickly change the rotational frequencies of both the CPU fan 32 and exhaust fan 52. This makes it possible to markedly improve the change speed of the rotational frequency of each of the CPU fan 32 and the exhaust fan 52 while helping prevent the occupant's sense of incongruity to the operating sound change accompanying the change of the rotational frequency of the CPU fan 32 and the exhaust fan 52.

In addition, the above rotational frequency control may be executed by the CPU 31. Alternatively, another microcomputer can be provided in the circuit board 3 to execute the present control. Further, a discrete circuit can be mounted in the circuit board 3 for executing the control.

(Effect)

(1) According to the audio-integrated apparatus 100 of the above embodiment, when the movable display section 1 is in the entirely closing state as a usual state, without need of being concerned about the operating sound heard in the maximally extending state or angle adjusting state, the rotational frequency of the cooling fan can be increased to the maximum level or value to satisfy the operating sound standard specification of the whole apparatus. The capability of cooling the CPU 31 of the circuit board 3 can be increased to the maximum level.

(2) The effect of the above embodiment is further explained with reference to a specific numerical value. Usually, the atmospheric temperature in the instrument panel is experientially 40 degrees centigrade. When the movable display section 1 is in the entirely closing state, as illustrated in FIG. 1, the cooling capability need to be satisfied while suctioning the atmosphere of about 40 degrees centigrade. In contrast, in the maximally extending state illustrated in FIG. 2 or the angle adjusting state illustrated in FIG. 3, cooling can be performed by using the atmosphere of the vehicle compartment. The vehicle compartment is kept at around 25 degrees centigrade to maintain a comfortable state for an occupant; thereby, the cooling can be performed by using the low-temperature suctioned atmosphere (i.e., intake air) having a temperature difference of no less than 15 degrees centigrade.

On the other hand, the atmosphere of the vehicle compartment has frequent circulation with the atmosphere outside of the vehicle via the window or the air-conditioner duct. Therefore, the dust may be included in great quantities depending on areas or the seasons. In addition, the danger of frequently suctioning the atmosphere having high humidity according to the weather cannot be denied.

The present invention is devised in accordance with the above feature while achieving improvement in not only marketability (i.e., reduction) of the operating sound but also the reliability or durability of the apparatus.

Aspects of the disclosure described herein are set out in the following clauses.

Attention is focused on a fact that an open/close position of a movable display section affects a suction quantity of a vehicle compartment atmosphere by a cooling fan and a transmission characteristic of an operating sound of the cooling fan into the vehicle compartment. Based on the state of the open/close position of the movable display section, a rotational frequency of the cooling fan is controlled.

As an aspect of the disclosure, an in-vehicle apparatus for a vehicle is provided as follows. A main body contains (i) a data read-out section configured to read data from a storage medium, (ii) a circuit board containing a CPU for processing data read by the data read-out section, and (iii) a cooling fan to cool the CPU. The main body has, in a front face thereof, a loading slot for inserting the storage medium. A movable display section is arranged in front of the main body and movable in a back-and-forth direction while having a display unit to display information in a front face of the display unit. A drive mechanism is configured to move the movable display section in the back-and-forth direction while changing, of the movable display section, an inclination state relative to the main body. A position detection section is configured to detect a position of the movable display section. A control section is configured to control a rotational frequency of the cooling fan based on a position of the movable display section detected by the position detection section.

Thus, the fan operating sound transmitted to the vehicle compartment can be reduced while securing the required cooling capability.

As an optional aspect, the drive mechanism may be further configured to move the movable display section in the back-and-forth direction, in a range from a concealing position via a partially exposing position to a maximally exposing position. The concealing position is a position at which the front face of the main body is concealed in case that the movable display section is moved back. The partially exposing position is a position at which the front face of the main body is partially exposed in case that the movable display section is moved forth and inclined towards the main body. The maximally exposing position is a position at which the front face of the main body is maximally exposed in case that the movable display section is moved further forth and inclined further towards the main body.

As an optional aspect, the control section may be further configured, when the movable display section is detected to be at the concealing position by the position detection section, to set the cooling fan to a first allowable rotational frequency, which is specified in a state that the front face of the main body is concealed, for satisfying a predetermined operating sound standard specification while securing a capability of cooling the CPU. Thus, the fan operating sound transmitted to the vehicle compartment can be reduced while securing the required cooling capability.

As an optional aspect, the control section may be further configured, when the movable display section is detected to be at the partially exposing position by the position detection section, to set the cooling fan to a second allowable rotational frequency, which is specified in a state that the front face of the main body is partially exposed, for satisfying a predetermined operating sound standard specification while securing a capability of cooling the CPU. Thus, the rotational frequency of the cooling fan can be reduced properly. The fan operating sound to the vehicle compartment can be reduced. In addition, the dew condensation inside of the in-vehicle apparatus and the dust entry into the in-vehicle apparatus can be reduced.

As an optional aspect, the control section may be further configured, when the movable display section is detected to be at the maximally exposing position by the position detection section, to set the cooling fan to a third allowable rotational frequency, which is specified in a state that the front face of the main body is maximally exposed, for satisfying a predetermined operating sound standard specification while securing a capability of cooling the CPU. Thus, by reducing the rotational frequency of the cooling fan properly, the fan operating sound to the vehicle compartment can be reduced; in addition, the dew condensation and dust entry inside the in-vehicle apparatus can be reduced.

As an optional aspect, the apparatus may further include a temperature sensor to detect a temperature in a vicinity of the CPU. The control section may be further configured to control the rotational frequency of the cooling fan based on (i) a position of the movable display section detected by the position detection section and (ii) a temperature in the vicinity of the CPU detected by the temperature sensor. Thus, the fan operating sound transmitted to the vehicle compartment can be reduced while securing the required cooling capability.

As an optional aspect, the control section may be further configured to set the cooling fan to the first allowable rotational frequency when a temperature in the vicinity of the CPU detected by the temperature sensor is equal to or greater than a predetermined cooling necessitating temperature, which requires cooling of the CPU, in case that the movable display section is detected to be at the partially exposing position or the maximally exposing position by the position detection section. The above configuration can reduce the possibility of the damage due to the heat with respect to the CPU or other electric components mounted in the circuit board.

As an optional aspect, the control section may be further configured to stop the cooling fan when a temperature in the vicinity of the CPU detected by the temperature sensor is equal to or less than a predetermined cooling not-necessitating temperature, which does not require cooling of the CPU, in case that the movable display section is detected to be at the partially exposing position or the maximally exposing position by the position detection section. The possibility of the dew condensation to the circuit board can be thus reduced.

As an optional aspect, the control section may be further configured, (i) to control the rotational frequency of the cooling fan with an integral control using a first control gain (K1) when the movable display section is not being moved, and (ii) to control the rotational frequency of the cooling fan with an integral control using a second control gain (K2), which is set to a greater value than the first control gain, when the movable display section is being moved.

Thus, the rotational frequency of the fan can be rapidly changed during the movement of the movable display section to thereby improve a switching speed of the fan's rotational frequency remarkably while reducing the occupant's sense of incongruity to the operating sound variation accompanying the change of the fan's rotational frequency.

It will be obvious to those skilled in the art that various changes may be made in the above-described embodiments of the present invention. However, the scope of the present invention should be determined by the following claims.

What is claimed is:

1. An in-vehicle apparatus for a vehicle, comprising:
   a main body containing
      a data read-out section configured to read data from a storage medium,
      a circuit board containing a CPU for processing data read by the data read-out section, and
      a cooling fan to cool the CPU,
      the main body having, in a front face thereof, a loading slot for inserting the storage medium;
   a movable display section arranged in front of the main body and movable in a back-and-forth direction while having a display unit to display information in a front face of the display unit;
   a drive mechanism configured to move the movable display section in the back-and-forth direction while changing, of the movable display section, an inclination state relative to the main body;
   a position detection section configured to detect a position of the movable display section; and
   a control section configured to control a rotational frequency of the cooling fan based on a position of the movable display section detected by the position detection section.

2. The in-vehicle apparatus according to claim 1,
   the drive mechanism being further configured to move the movable display section in the back-and-forth direction, in a range from a concealing position via a partially exposing position to a maximally exposing position, the concealing position at which the front face of the main body is concealed in case that the movable display section is moved back, the partially exposing position at which the front face of the main body is partially exposed in case that the movable display section is moved forth and inclined towards the main body, the maximally exposing position at which the front face of the main body is maximally exposed in case that the movable display section is moved further forth and inclined further towards the main body.

3. The in-vehicle apparatus according to claim 2,
the control section being further configured,
when the movable display section is detected to be at the concealing position by the position detection section,
to set the cooling fan to a first allowable rotational frequency, which is specified in a state that the front face of the main body is concealed, for satisfying a predetermined operating sound standard specification while securing a capability of cooling the CPU.

4. The in-vehicle apparatus according to claim 2,
the control section being further configured,
when the movable display section is detected to be at the partially exposing position by the position detection section,
to set the cooling fan to a second allowable rotational frequency, which is specified in a state that the front face of the main body is partially exposed, for satisfying a predetermined operating sound standard specification while securing a capability of cooling the CPU.

5. The in-vehicle apparatus according to claim 2,
the control section being further configured,
when the movable display section is detected to be at the maximally exposing position by the position detection section,
to set the cooling fan to a third allowable rotational frequency, which is specified in a state that the front face of the main body is maximally exposed, for satisfying a predetermined operating sound standard specification while securing a capability of cooling the CPU.

6. The in-vehicle apparatus according to claim 2, further comprising:
a temperature sensor configured to detect a temperature in a vicinity of the CPU,
the control section being further configured to control the rotational frequency of the cooling fan based on (i) a position of the movable display section detected by the position detection section and (ii) a temperature in the vicinity of the CPU detected by the temperature sensor.

7. The in-vehicle apparatus according to claim 6,
the control section being further configured to set the cooling fan to the first allowable rotational frequency when a temperature in the vicinity of the CPU detected by the temperature sensor is equal to or greater than a predetermined cooling necessitating temperature, which requires cooling of the CPU, in case that the movable display section is detected to be at the partially exposing position or the maximally exposing position by the position detection section.

8. The in-vehicle apparatus according to claim 6,
the control section being further configured to stop the cooling fan when a temperature in the vicinity of the CPU detected by the temperature sensor is equal to or less than a predetermined cooling not-necessitating temperature, which does not require cooling of the CPU, in case that the movable display section is detected to be at the partially exposing position or the maximally exposing position by the position detection section.

9. The in-vehicle apparatus according to claim 1,
the control section being further configured,
to control the rotational frequency of the cooling fan with an integral control using a first control gain when the movable display section is not being moved, and
to control the rotational frequency of the cooling fan with an integral control using a second control gain, which is set to a greater value than the first control gain, when the movable display section is being moved.

* * * * *